(12) United States Patent
Arita et al.

(10) Patent No.: US 6,313,583 B1
(45) Date of Patent: Nov. 6, 2001

(54) PLASMA PROCESSING APPARATUS AND METHOD

(75) Inventors: Kiyoshi Arita, Fukuoka-ken; Isam Morisako, Fukuoka; Hiroshi Haji, Chikushino, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/450,587

(22) Filed: Nov. 30, 1999

(30) Foreign Application Priority Data

Dec. 1, 1998 (JP) .................................................. 10-341243

(51) Int. Cl.$^7$ ...................................................... H01J 7/24
(52) U.S. Cl. ...................................... 315/111.21; 315/360
(58) Field of Search ........................... 315/111.21, 111.01, 315/111.31, 360; 219/121.43, 121.54

(56) References Cited

U.S. PATENT DOCUMENTS

| | | | |
|---|---|---|---|
| 4,970,435 | * 11/1990 | Tanaka et al. | 315/111.21 |
| 5,543,689 | * 8/1996 | Ohta et al. | 315/111.21 |
| 5,708,250 | * 1/1998 | Benjamin et al. | 219/121.54 |
| 5,916,455 | * 6/1999 | Kumagai | 216/68 |
| 6,031,198 | * 2/2000 | Moriyama et al. | 219/121.43 |

FOREIGN PATENT DOCUMENTS

| | | |
|---|---|---|
| 992491 | 4/1997 | (JP) . |
| 10125494 | 5/1998 | (JP) . |

* cited by examiner

Primary Examiner—Don Wong
Assistant Examiner—Thuy Vinh Tran
(74) Attorney, Agent, or Firm—Stevens, Davis, Miller & Mosher, LLP

(57) ABSTRACT

In a plasma processing apparatus and method in which a high-frequency voltage is applied to a discharging electrode to generate a plasma in a vacuum chamber, thereby performing a plasma processing for a substrate on the discharging electrode, a voltage of a discharging circuit for producing a plasma discharge is detected by a monitor control unit. The detection is made by virtue of a resistor inserted in a circuit connecting the discharging circuit and a matching unit which takes the matching in impedance between a high-frequency power supply unit and the discharging circuit. The high-frequency power supply unit is controlled on the basis of the result of detection. Also, the result of detection is compared with a reference value obtained in an initial state in which no deposited layer exists in the vacuum chamber. The comparison is made for estimating a time dependent change in internal state of the vacuum chamber. Thereby, it is possible to make the setting of an adequate power supply output corresponding to the substrate to be processed and corresponding to the time dependent change of the vacuum chamber always.

15 Claims, 8 Drawing Sheets

PLASMA PROCESSING APPARATUS AND METHOD

BACKGROUND OF THE INVENTION

The present invention relates to a plasma processing apparatus and method in which a plasma processing is performed for an object of processing such as a substrate.

A plasma processing apparatus is known as an apparatus for performing a processing for cleaning of a substrate surface on which electronic parts are to be mounted. In this plasma processing apparatus, a plasma discharge is generated in an evacuated vacuum chamber by applying a high-frequency voltage to a discharging electrode in the vacuum chamber after the introduction of a plasma generating gas into the vacuum chamber. A plasma processing for an object of processing placed on the discharging electrode is performed by the action of ions, electrons or the like generated by the plasma discharge.

In order to obtain an adequate processing effect by this plasma processing, it is necessary that a plasma processing condition such as the value of a high-frequency voltage applied to the discharging electrode should be set adequately in accordance with the object of processing. Hitherto, the setting of the plasma processing condition has been made on the basis of the result of a condition determining work performed for determining the optimum processing condition for each object of processing.

However, an effective electric power representing the action of the plasma discharge for plasma generation exerted on the object of processing differs depending upon the size, thickness and material of the object of processing. Therefore, in the case where a plasma processing is performed under the same condition, it is not possible to avoid the variations in quality of the plasma processing even in the case of similar objects of processing.

Also, at the time of operation of the plasma processing apparatus, removed substances attach to the inner wall of the vacuum chamber due to reverse sputtering so that a deposited layer is gradually formed on the inner wall of the vacuum chamber with the lapse of the operating time. This deposited layer causes a change in impedance of a plasma discharging circuit. Therefore, the effective electric power for the object of processing has a time dependent change even if a power supply output condition is kept constant. Accordingly, no adequate plasma processing condition is ensured resulting in that the variations in quality of the plasma processing are generated. Thus, the conventional plasma processing has a problem that owing to the difference between objects of processing and the time dependent change in internal state of the vacuum chamber, it is difficult to keep the adequate plasma processing condition.

SUMMARY OF THE INVENTION

Therefore, an object of the present invention is to provide a plasma processing apparatus and method in which an adequate plasma processing condition can be kept always.

According to a first aspect of the present invention, there is provided a plasma processing apparatus in which a plasma generating gas is introduced into an evacuated vacuum chamber and a high-frequency voltage is applied to a discharging electrode provided in the vacuum chamber to generate a plasma in the vacuum chamber, thereby performing a plasma processing for an object of processing placed on the discharging electrode, the apparatus comprising a high-frequency power supply unit for applying the high-frequency voltage to the discharging electrode, a matching unit for taking the matching in impedance between the high-frequency power supply unit and a discharging circuit which produces a plasma discharge, detection means for detecting a voltage and/or current of the discharging circuit by virtue of a resistor inserted in a circuit which connects the matching unit and the discharging electrode, and control means for controlling the high-frequency power supply unit on the basis of the result of detection by the detection means.

According to a second aspect of the present invention, there is provided a plasma processing apparatus in which a plasma generating gas is introduced into an evacuated vacuum chamber and a high-frequency voltage is applied to a discharging electrode provided in the vacuum chamber to generate a plasma in the vacuum chamber, thereby performing a plasma processing for an object of processing placed on the discharging electrode, the apparatus comprising a high-frequency power supply unit for applying the high-frequency voltage to the discharging electrode, a matching unit for taking the matching in impedance between the high-frequency power supply unit and a discharging circuit which produces a plasma discharge, detection means for detecting a voltage and/or current of the discharging circuit by virtue of a resistor inserted in a circuit which connects the matching unit and the discharging electrode, and judgement means for judging a time dependent change in internal state of the vacuum chamber through the comparison of the result of detection by the detection means with a preset reference value to give predetermined notice.

According to a third aspect of the present invention, there is provided a plasma processing method in which a plasma generating gas is introduced into a vacuum chamber after the evacuation thereof and a high-frequency voltage is applied by a high-frequency power supply unit to a discharging electrode provided in the vacuum chamber to generate a plasma in the vacuum chamber, thereby performing a plasma processing for an object of processing placed on the discharging electrode, the method comprising a step of detecting a voltage and/or current of a discharging circuit which produces a plasma discharge, the detection being made by virtue of a resistor inserted in a circuit connecting the discharging electrode and a matching unit which takes the matching in impedance between the high-frequency power supply unit and the discharging circuit, and a step of controlling the high-frequency power supply unit on the basis of the result of detection.

According to a fourth aspect of the present invention, there is provided a plasma processing method in which a plasma generating gas is introduced into a vacuum chamber after the evacuation thereof and a high-frequency voltage is applied by a high-frequency power supply unit to a discharging electrode provided in the vacuum chamber to generate a plasma in the vacuum chamber, thereby performing a plasma processing for an object of processing placed on the discharging electrode, the method comprising a step of detecting a voltage and/or current of a discharging circuit which produces a plasma discharge, the detection being made by virtue of a resistor inserted in a circuit connecting the discharging electrode and a matching unit which takes the matching in impedance between the high-frequency power supply unit and the discharging circuit, and a step of judging a time dependent change in internal state of the vacuum chamber through the comparison of the result of detection with a preset reference value to give predetermined notice.

With the apparatus and method according to the first and third aspects, it is possible to perform the setting of an adequate power supply output always by detecting the voltage and/or current of the discharging circuit by virtue of the resistor inserted in the circuit connecting the matching unit and the discharging electrode and controlling the high-frequency power supply unit on the basis of the result of detection.

With the apparatus and method according to the second and fourth aspects, it is possible to judge the time dependent change in internal state of the vacuum chamber by comparing there result of detection with the preset reference value.

DESCRIPTION OF THE PREFERRED EMBODIMENTS

Embodiments of the present invention will now be described in reference to the drawings.

Figure 1:
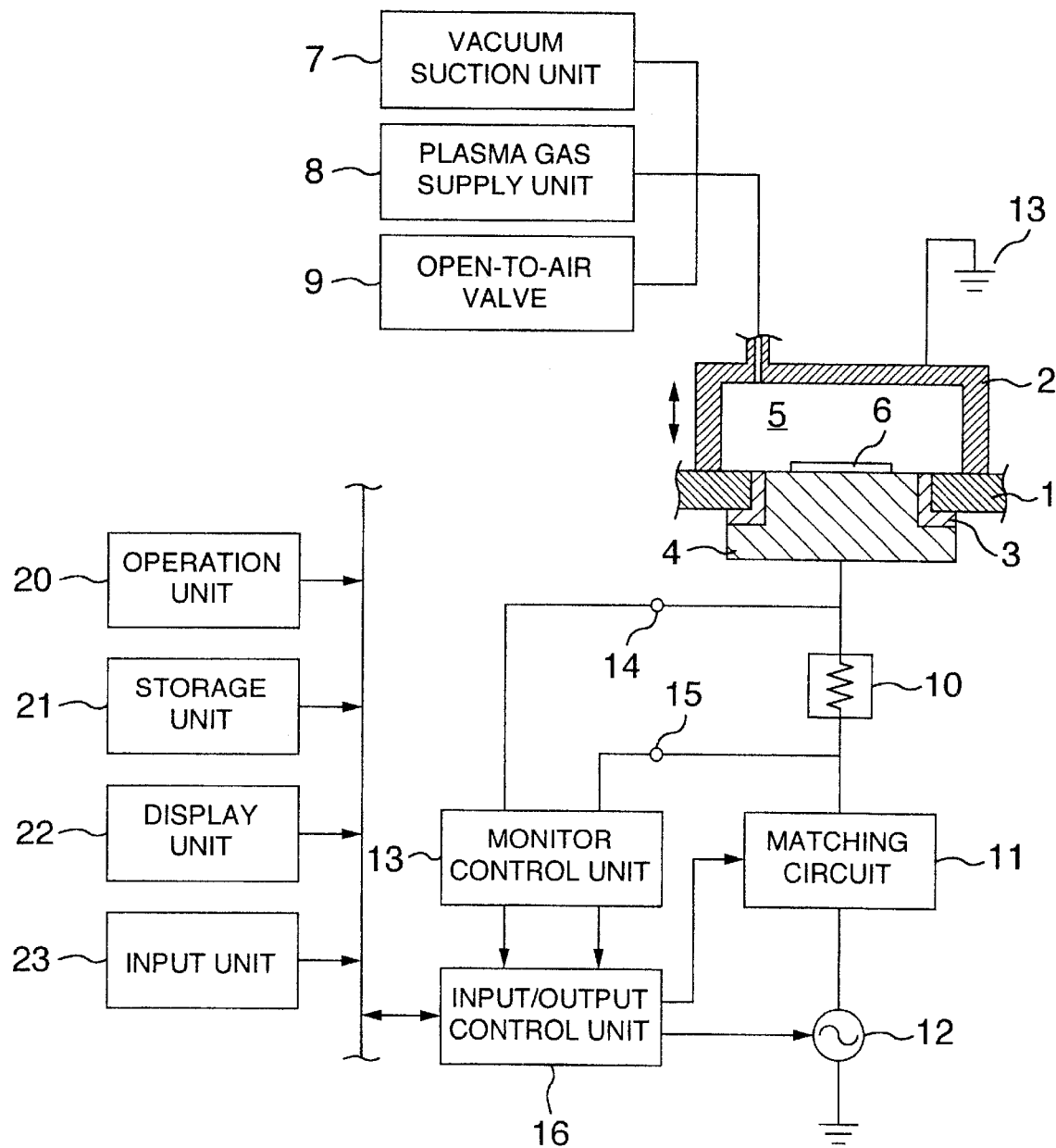
FIG. 1 is a block diagram showing the construction of a plasma processing apparatus according to an embodiment of the present invention.

First, the construction of a plasma processing apparatus according to an embodiment of the present invention will be described referring to FIG. 1. In FIG. 1, a cover member 2 is provided on a base member 1 so that the cover member 2 can freely go up and down. A discharging electrode 4 is mounted through an insulating member 3 to the base member 1 from the lower side so that a space enclosed by the base member 1, the discharging electrode 4 and the cover member 2 forms a vacuum chamber 5. A substrate 6 made an object of plasma processing is placed on an upper surface of the discharging electrode 4. The substrate 6 is different in size, thickness and material depending on the kind thereof.

A vacuum suction unit 7, a plasma gas supply unit 8 and an open-to-air valve 9 are connected to the cover member 2 through a pipeline. The vacuum suction unit 7 evacuates the air in the vacuum chamber 5 to make vacuous. The plasma gas supply unit 8 supplies a plasma generating gas such as an argon gas into the vacuum chamber 5. The open-to-air valve 9 is opened, at the time of destruction of a vacuum state in the vacuum chamber 5 conducted after a plasma processing, so that the air is introduced into the vacuum chamber 5.

A high-frequency power supply unit 12 is connected to the discharging electrode 4 through a probe 10 and a matching circuit 11. When the high-frequency power supply unit 12 is driven, a high-frequency voltage for plasma discharge is applied between the discharging electrode 4 and the cover member 2 connected to a ground portion 13. The matching circuit 11 is a matching unit for taking the matching in impedance between the high-frequency power supply unit 12 and a plasma discharging circuit which generates a plasma in the vacuum chamber 5. The probe 10 is a resistor inserted in a circuit which connects the matching circuit 11 and the discharging electrode 4. A voltage and/or current of the plasma discharging circuit can be detected by detecting a voltage between voltage detection points 14 and 15 by a monitor control unit 13. Namely, the probe 10 and the monitor control unit 13 serve as detection means.

An input/output control unit 16 receives the result of detection by the monitor control unit 13 and controls the matching circuit 11 and the high-frequency power supply unit 12. An operation unit 20 performs an operation of making the comparison between a voltage value or current value detected by the probe 10 and the monitor control unit 13 and a reference value to determine a difference therebetween. A storage unit 21 stores various kinds of data necessary for operations of the plasma processing apparatus. The data includes those of plasma processing conditions (gas flow quantity pressure, discharge time, power supply output set value), such data being set for each kind of substrate by a condition determining work. A display unit 22 is a display monitor which displays an operation window and an input window at the time of data input and operation input by an input unit 23 and serves as notice or informing means giving various notices including an warning representative of the abnormality of the internal state of the vacuum chamber 5. The input/output control unit 16, the operation unit 20, the storage unit 21, the display unit 22 and the input unit 23 serve as control means for controlling the high-frequency power supply unit 12 on the basis of the detected voltage value or current value.

Figure 2A:
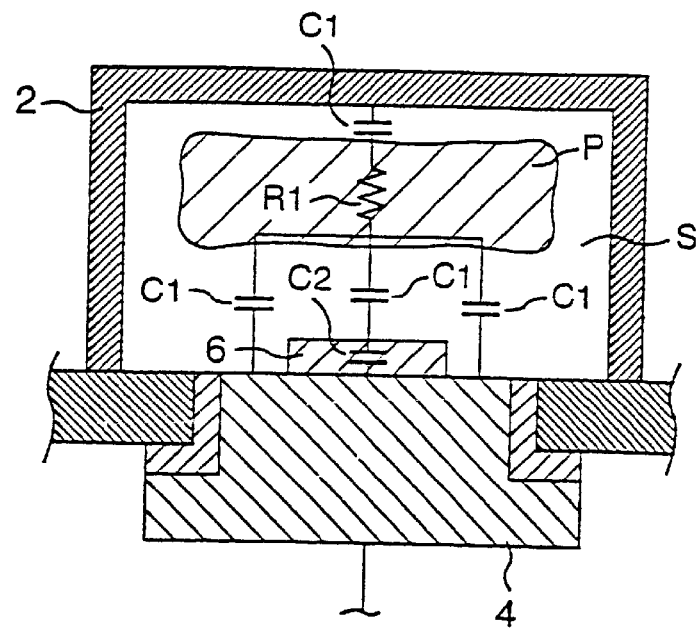
FIGS. 2a and 2b are cross sections of the plasma processing apparatus of the embodiment of the present invention for showing the characteristics of a plasma discharge.

Next, the characteristics of a plasma discharge will be described in reference to FIGS. 2a and 2b. FIG. 2a illustrates the model of a plasma in the vacuum chamber 5 represented using an equivalent circuit. In the equivalent circuit shown in FIG. 2a, a plasma P, a sheath area S surrounding the plasma P and the substrate 6 placed on the discharging electrode 4 are replaced by a resistor R1, a condenser of capacitance C1 and a condenser of capacitance C2, respectively. In a state in which the plasma generating gas exists with a pressure on the order of several Pa which is a general condition at the time of plasma processing, the capacitance C1 of the sheath area S takes a value which is remarkably large as compared with the capacitance C2 of the substrate 6. A composite capacitance Csub of a portion having the substrate 6 on the discharging electrode 4 is given by Csub=(C1×C2)/(C1+C2) and is smaller than the capacitance C1 in the case where no substrate 6 exists.

An overall capacitance CT on the discharging electrode 4 becomes smaller as the area of the substrate 6 is increased. Under the condition that the area of the substrate 6 is fixed, CT becomes smaller as the thickness of the substrate 6 is increased and CT becomes smaller as the inductivity of the material of the substrate 6 is smaller. Thus, the overall capacitance CT changes with the change of the area, thickness and material of the substrate 6 as the object of processing, thereby causing a change in impedance of the equivalent circuit. As a result, an effective electric power for the substrate 6 at the time of plasma processing changes.

Figure 7:
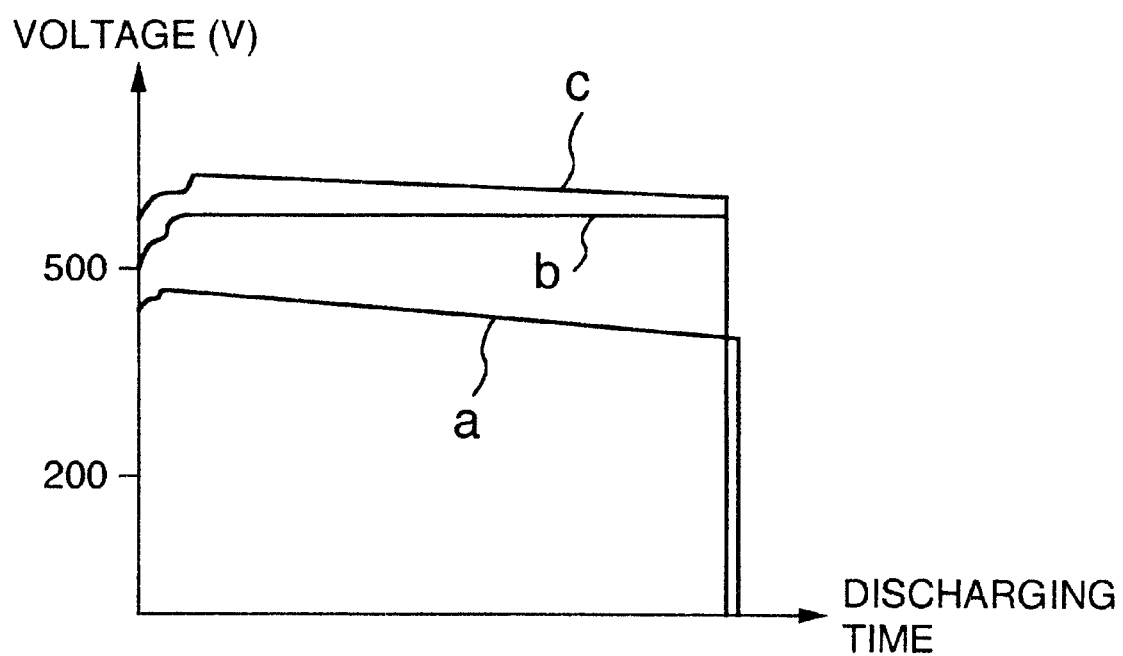
FIG. 7 shows the results of measurement of a discharge voltage by the plasma processing apparatus of the embodiment of the present invention.

FIG. 7 shows an example of results of measurement of such a change of the effective electric power. Curves a, b and c in FIG. 7 represent respective voltage values measured by use of the probe 10 in a state in which a substrate 6 made of glass epoxy resin does not exist on the discharging electrode 4, in a state in which one substrate 6 is placed and in a state in which two substrates 6 are placed. In each case, a power supply output set to the same condition (500 W). As apparent from FIG. 7, the voltage value differs depending on the presence/absence of the substrate 6 and the number of the substrates 6. Namely, the effective electric power differs even if the same power supply output condition is established. Accordingly, in order to obtain an adequate plasma processing effect, it is required that a plasma processing condition including a power supply output should be set adequately in accordance with the kind of a substrate 6 as the object of processing and the number of substrates 6.

Figure 2B:
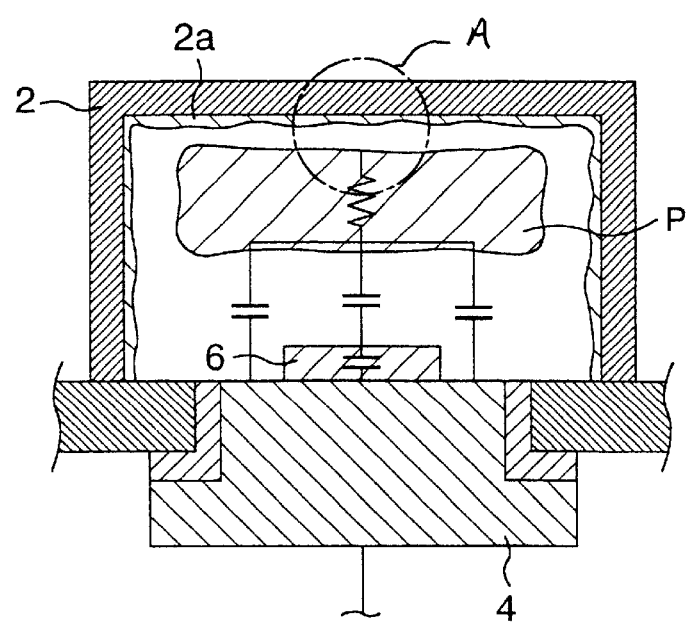
Figure 2C:
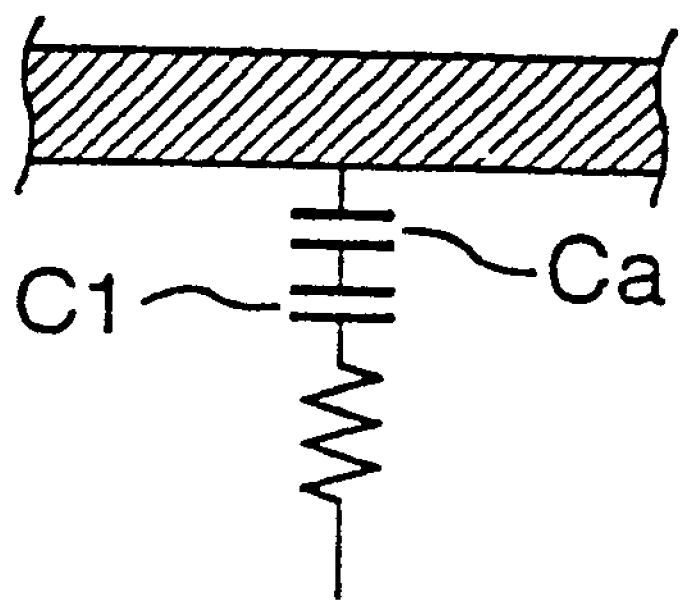
FIG. 2c illustrates the additional capacitance generated on the inner wall of the vacuum chamber.

FIG. 2b shows the influence of the time dependent change of the internal state of the vacuum chamber 5. In the plasma processing, the substances of the object of processing are scattered due to reverse sputtering and attach to the inner wall of the cover member 2 so that a deposited layer 2a is formed with the lapse of time. As shown in FIG. 2b, the deposited layer 2a serves as a capacitance component to generate an additional capacitance Ca (see the illustration of the circled portion of FIG. 2b shown in FIG. 2c) on the inner wall of the vacuum chamber 5 which is provided in addition to the overall capacitance CT shown in FIG. 2a. In this case, Ca becomes smaller as the thickness of the deposited layer 2a is increased. As a result, the overall capacitance CT becomes smaller. Ca is infinitely large at the time of start of use of the apparatus or in an initial state in which the deposited layer 2a does not exist. Thus, the impedance of the equivalent circuit changes depending on the substrate 6 as well as the growth of the deposited layer 2a in the vacuum chamber 5. Therefore, in order that the processing effect of the substrate as the object of processing is kept constant, the state of the deposited layer 2a at that point of time should also be taken into consideration.

Figure 3:
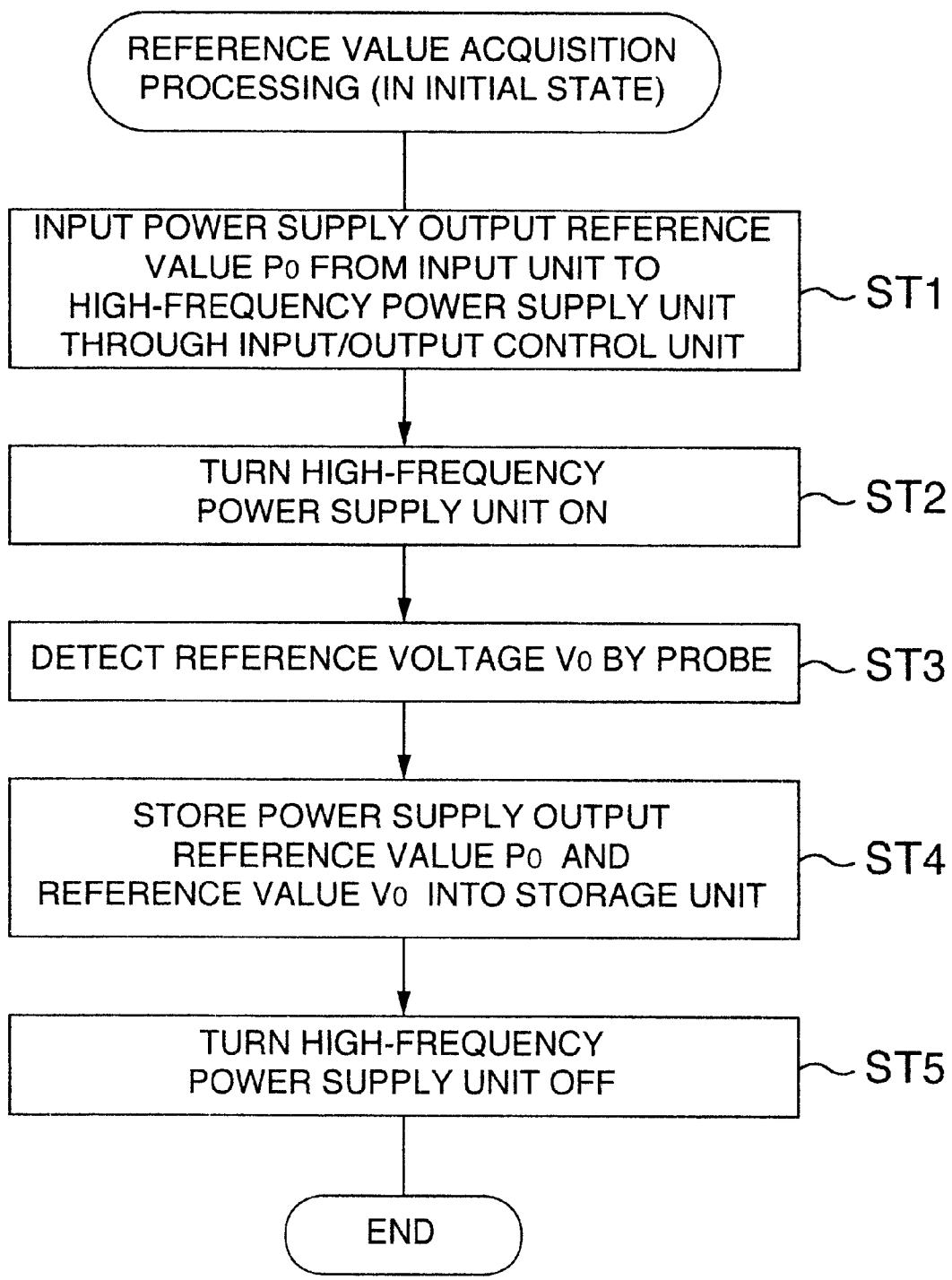
FIG. 3 is a flow chart showing a reference value acquisition processing in an initial state which is performed in the plasma processing apparatus of the embodiment of the present invention.

Next, the description will be made of a processing performed in order to keep the plasma processing effect always adequate irrespective of the substrate to be processed and the time dependent change in internal condition of the vacuum chamber 5. First, a processing for acquiring a reference value in an initial state will be described referring to a flow chart shown in FIG. 3. This processing is performed, for example, at the time of start of use of the plasma processing apparatus or after the cleaning of the interior of the vacuum chamber 5 for maintenance. The reference value acquisition processing is performed for acquiring a reference value representative of a condition in a state in which the internal state of the vacuum chamber 5 is satisfactory.

First, a power supply output reference value P0 is inputted from the input unit 23 to the high-frequency power supply unit 12 through the input/output control unit 16 (step ST1). The power supply output reference value P0 is defined for the purpose of detecting a change in impedance caused by a time dependent change in internal state of the vacuum chamber 5 irrespective of each substrate to be processed. Next, the high-frequency power supply unit 12 is turned on (step ST2) to detect a reference voltage V0 by use of the probe 10 (step ST3). The power supply output reference value P0 and the detected reference voltage V0 are stored into the storage unit 21 (step ST4) and the high-frequency power supply unit 12 is turned off (step ST5), thereby completing the reference value acquisition processing in the initial state.

Figure 4:
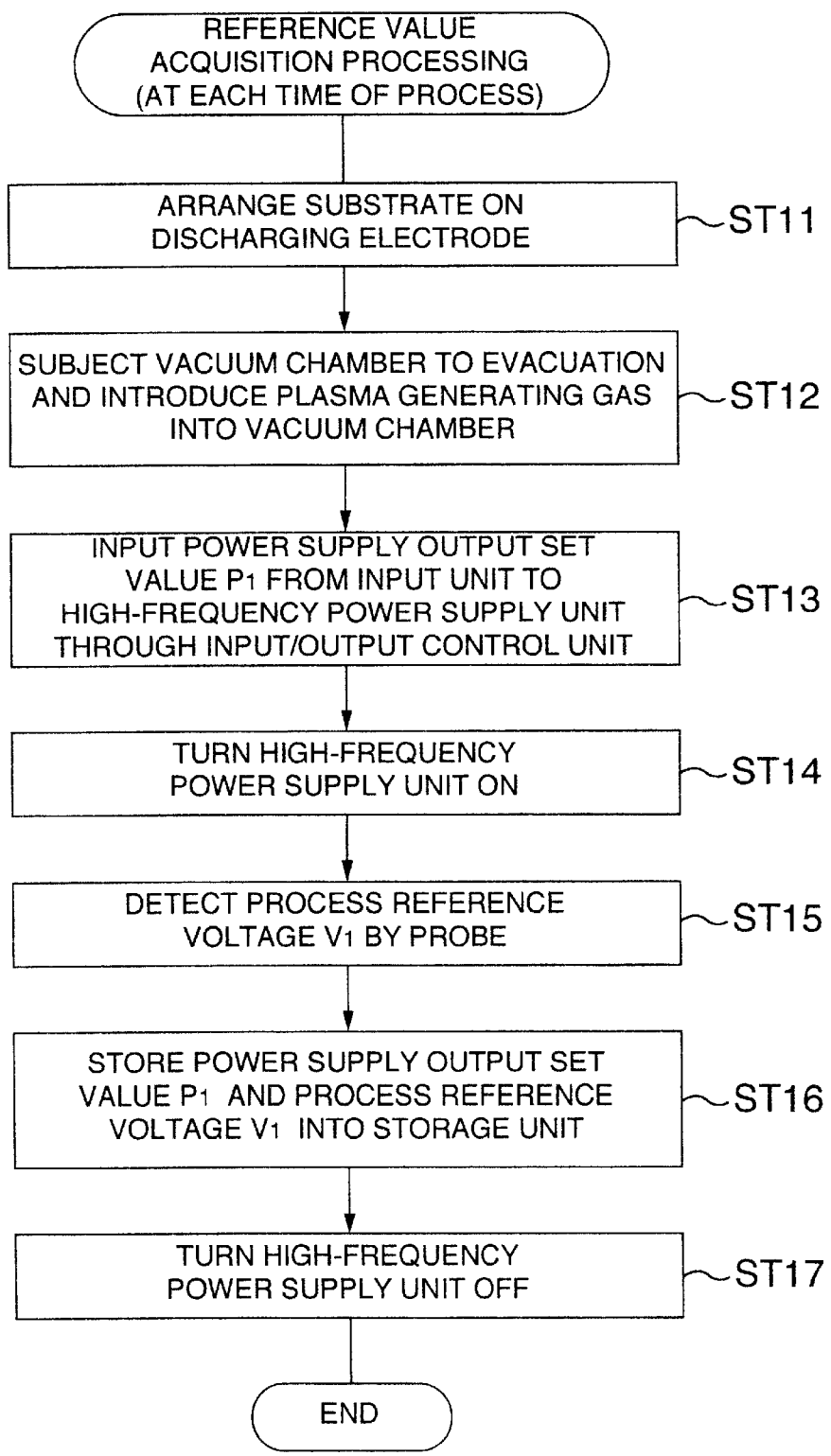
FIG. 4 is a flow chart showing a reference value acquisition processing at each time of process which is performed in the plasma processing apparatus of the embodiment of the present invention.

Next, a processing for acquiring a reference value for each substrate to be processed (or a process reference value) will be described referring to FIG. 4. Prior to the processing, a condition determining work is performed to determine or set the processing condition for each kind of substrate. Thereafter the reference value acquisition processing is performed to a first substrate to be processed of a different kind from a just preceding one. A power supply output set value P1 as an adequate power supply output has already been determined by the condition determining work for the corresponding kind of the substrate. First, a substrate 6 is arranged on the discharging electrode 4 (step ST11). The vacuum chamber 5 is subjected to evacuation and a plasma generating gas is thereafter introduced into the vacuum chamber 5 (step ST12). Next, the power supply output set value P1 is inputted from the input unit 23 to the high-frequency power supply unit 12 through the input/output control unit 16 (step ST13). Then, the high-frequency power supply unit 12 is turned on (step ST14) to detect a process reference voltage V1 by use of the probe 10 (step ST15). The power supply output set value P1 and the detected process reference voltage V1 are stored into the storage unit 21 (step ST16) and the high-frequency power supply unit 12 is turned off (step ST17), thereby completing the reference value acquisition processing.

Figure 5:
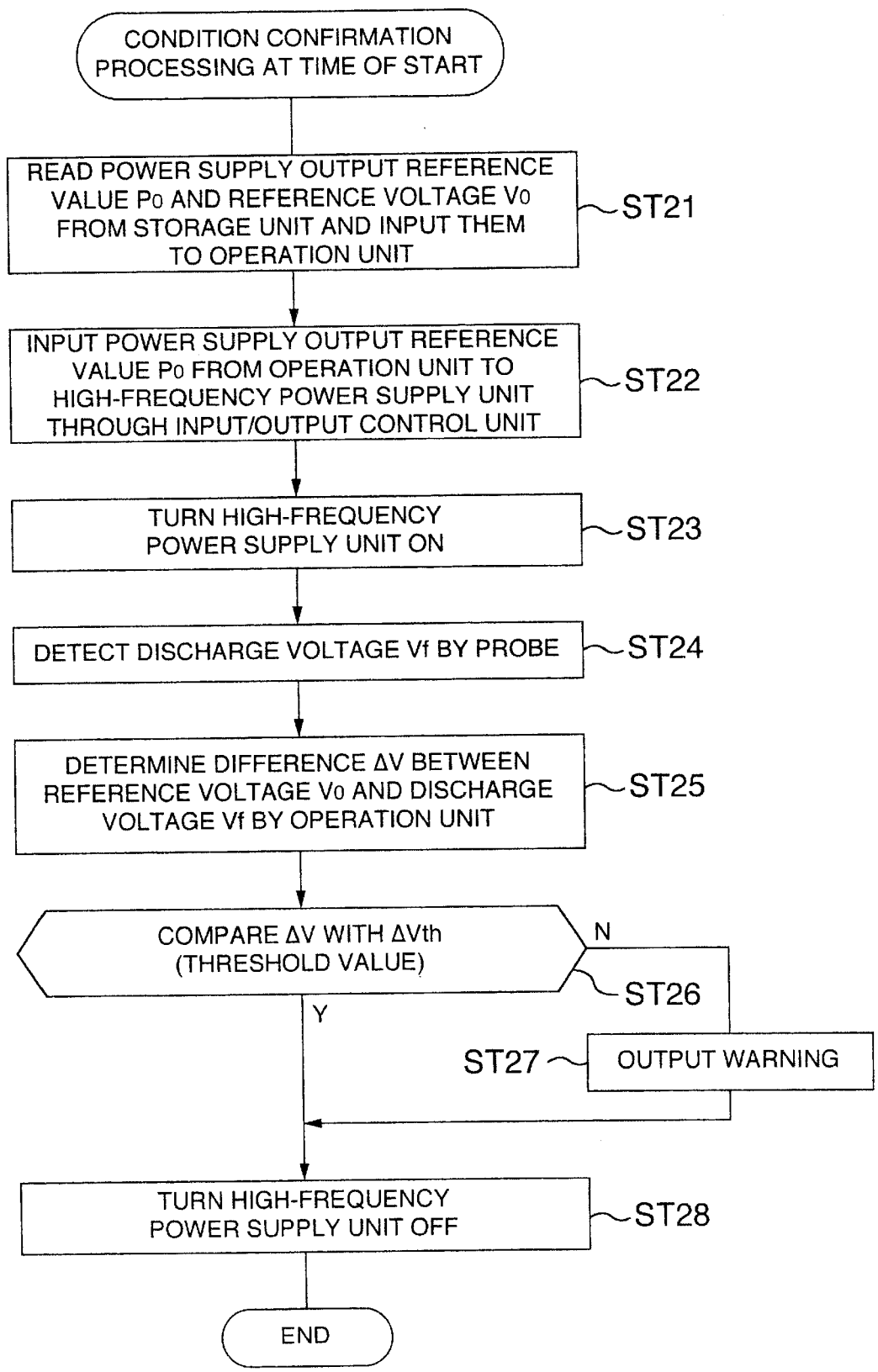
FIG. 5 is a flow chart showing a condition confirmation processing at the time of start which is performed in the plasma processing apparatus of the embodiment of the present invention.

Next, a condition confirmation processing performed at each time of start of the plasma processing apparatus will be described referring to FIG. 5. This condition confirmation is made for confirming whether or not the degree of a time dependent change in internal state caused by the growth of a deposited layer on the inner wall of the vacuum chamber 5 falls within a tolerance. First, the power supply output reference value P0 and the reference voltage V0 indicative of the voltage value in the initial state are read from the storage unit 21 and are inputted to the operation unit 20 (step ST21). Next, the power supply output reference value P0 is inputted from the operation unit 20 to the high-frequency power supply unit 12 through the input/output control unit 16 (step ST22). Then, the high-frequency power supply unit 12 is turned on (step ST23) to detect a discharge voltage Vf by use of the probe 10 (step ST24).

The operation unit 20 determines a difference $\Delta V$ between the reference voltage V0 and the discharge voltage Vf (step ST25) and compares the difference $\Delta V$ with a threshold value $\Delta Vth$ (step ST26). If the difference $\Delta V$ is not smaller than the threshold value $\Delta Vth$, notice or information of a predetermined warning is outputted with the judgement of the time dependent change in internal state of the vacuum chamber 5 made as being beyond the tolerance (step ST27). With this warning, a predetermined maintenance work such as the cleaning of the interior of the vacuum chamber 5 or the exchange of shielding parts is to be conducted. Namely, the operation unit 20 is judgement means for judging the time dependent change in internal state of the chamber. On the other hand, if the difference $\Delta V$ is smaller than the threshold value $\Delta Vth$, the time dependent change in internal state of the vacuum chamber 5 is judged as falling within the tolerance and hence the high-frequency power supply unit 12 is immediately turned off (step ST28), thereby completing the condition confirmation processing at the time of start.

Figure 6:
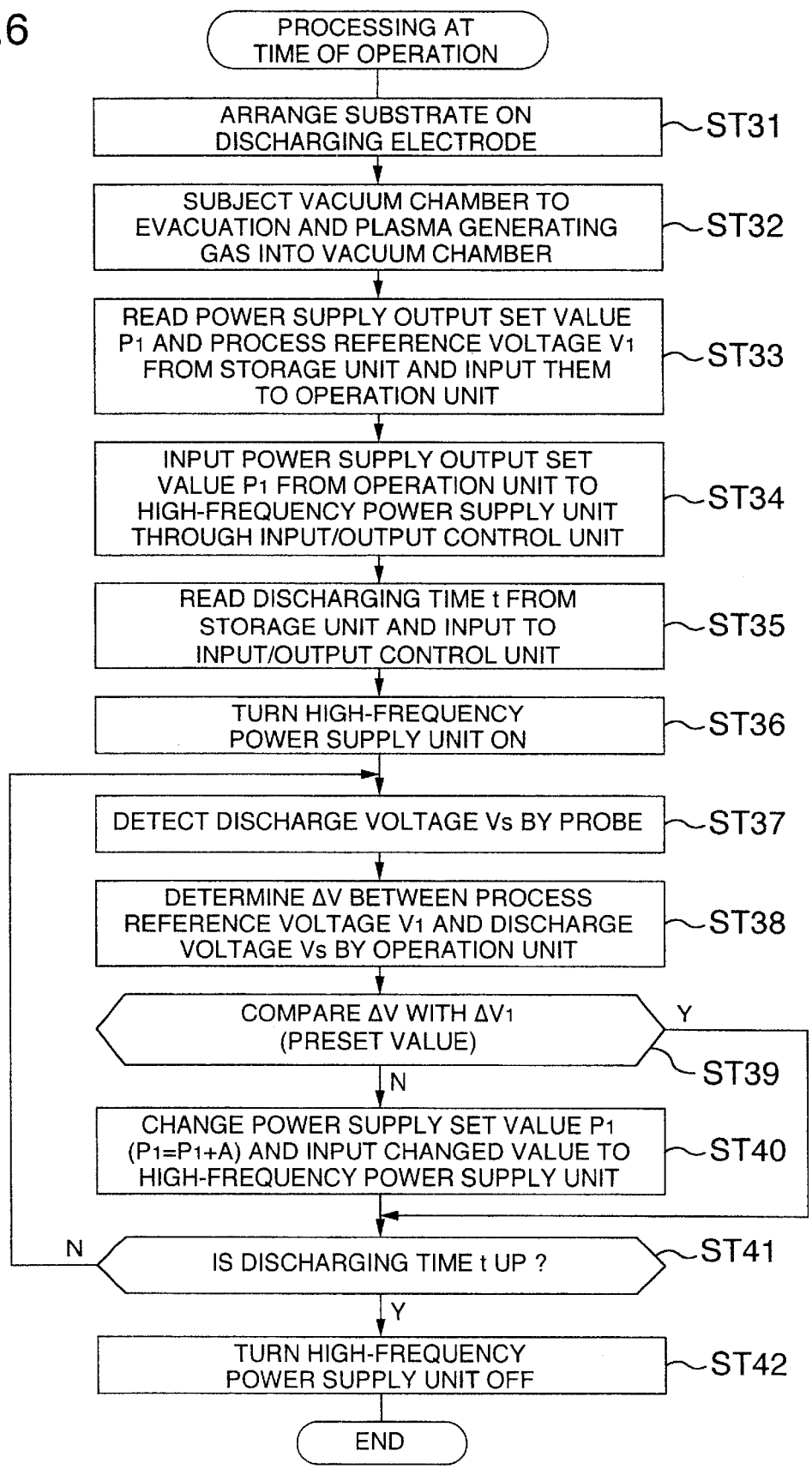
FIG. 6 is a flow chart showing a processing at the time of operation which is performed in the plasma processing apparatus of the embodiment of the present invention.

Next, a processing at the time of operation of the plasma processing apparatus will be described referring to FIG. 6. This processing is performed for ensuring an adequate plasma processing condition at the time of actual plasma processing. First, a substrate 6 is arranged on the discharging electrode 4 (step ST31). The vacuum chamber 5 is subjected to evacuation and a plasma generating gas is thereafter introduced into the vacuum chamber 5 (step ST32). Next, a power supply output set value P1 corresponding to the substrate 6 to be processed and the process reference voltage V1 determined by the process reference value acquisition processing are read from the storage unit 21 and are inputted to the operation unit 20 (step ST33). Then, the power supply output set value P1 is inputted from the operation unit 20 to the high-frequency power supply unit 12 through the input/output control unit 16 (step ST34). Thereafter, a discharging time t is read from the storage unit 21, which time t was determined by the condition determining work and stored, and is inputted to the input/output control unit 16 (step ST35) and the high-frequency power supply unit 12 is turned on (step ST36).

Thereafter, a discharge voltage Vs is detected by the probe 10 (step ST37). The operation unit 20 determines a difference $\Delta V$ between the process reference voltage V1 and the detected discharge voltage Vs (step ST38) and compares the determined difference $\Delta V$ with a preset value $\Delta V1$ (step ST39). The preset value $\Delta V1$ is set on the basis of the tolerable range of variations of the plasma processing effect. If the difference $\Delta V$ is smaller than a preset value $\Delta V1$, that is, if the discharge voltage Vs falls in a predetermined preset range it is determined that the plasma processing effect falls in a tolerance, the plasma processing is continued until it is confirmed that the preset discharging time t is up (step ST41).

On the other hand, if it is determined in step ST39 that the difference $\Delta V$ is not smaller than the preset value $\Delta V1$, it is meant that the discharge voltage Vs is out of a proper voltage. In this case, the power supply output set value P1 at the present point of time is changed by adding a predetermined value A thereto and the changed value P1 is newly inputted to the high-frequency power supply unit 12 (step ST40) and the flow returns to step ST37 to detect the discharge voltage Vs again. The processings up to step ST40 are repeated. With the confirmation of the time-up of the discharging time t (step ST41), the high-frequency power supply unit 12 is turned off (step ST42), thereby completing the plasma processing.

In the present embodiment as described in the foregoing, a discharge voltage is detected at each time of operation of the plasma processing apparatus in order that an effective electric power for an object of processing at the time of plasma processing is kept constant. In the case where the detected discharge voltage is out of a tolerance, a necessary feedback is made for the high-frequency power supply unit. In the present embodiment, the detection is made by inserting the resistor between the discharging electrode 4 and the matching circuit 11. This method has the following superior merits as compared with the conventional method in which an impedance in the vacuum chamber 5 is directly measured for the similar purpose of feedback.

Though the measurement of an impedance has a need to determine the phase of a current/voltage in addition to voltage/current data, the method according to the present embodiment requires only the detection of a voltage or current. In the present embodiment, it is therefore possible to shorten a detecting/processing time and to simplify the measuring/operating function, thereby reducing the installation or equipment cost. Also, with the detection of a voltage between the discharging electrode 4 and the matching circuit 11, an influence which the change of the substrate 6 to be processed gives on a value to be detected can be measured with a high sensitivity. Therefore, the stability of sensitivity is superior as compared with the conventional method in which a sensor is installed in the vacuum chamber 5.

Further, in the present embodiment, a reference value for a voltage when no deposited layer exists in the vacuum chamber 5 is determined so that it is sure at the time of start to compare a detected value with the reference value. Thereby, it is possible to accurately give notice of a timing for a maintenance work for the vacuum chamber 5. As a result, it is possible to reduce a load imposed for maintenance and/or management. In the foregoing embodiment, a voltage is determined as the reference value or the value to be detected. However, a current may be determined in lieu of the voltage.

According to the present invention, a voltage or current of a discharging circuit is detected by a resistor inserted in a circuit connecting a matching unit and a discharging electrode and a high-frequency power supply is controlled on the basis of the result of detection. Thereby, it is possible to set an adequate power supply output always in accordance with a substrate to be processed so that the quality of plasma processing is kept. Also, the result of detection is compared with a reference value in an initial state. Thereby, it is possible to properly estimate a time dependent change in internal state of a vacuum chamber. As a result, it is possible to adequately judge whether or not the maintenance is required.

What is claimed is:

1. A plasma processing apparatus in which a plasma generating gas is introduced into an evacuated vacuum chamber and a high-frequency voltage is applied to a discharging electrode provided in said vacuum chamber to generate a plasma in said vacuum chamber, thereby performing a plasma processing for an object of processing placed on said discharging electrode, the apparatus comprising:

a high-frequency power supply unit for applying the high-frequency voltage to said discharging electrode, a matching unit for taking the matching in impedance between said high-frequency power supply unit and a discharging circuit which produces a plasma discharge, detection means for detecting an impedance of said discharging circuit by detecting at least one of voltage and current of a resistor connected between said matching unit and said discharging electrode, and control means for controlling said high-frequency power supply unit an the basis of the result of detection by said detection means.

2. The apparatus of claim 1, wherein the detection means detects a voltage of the resistor.

3. The apparatus of claim 1, wherein the detection means detects a current of the resistor.

4. A plasma processing apparatus in which a plasma generating gas is introduced into an evacuated vacuum chamber and a high-frequency voltage is applied to a discharging electrode provided in said vacuum chamber to generate a plasma in said vacuum chamber, thereby performing a plasma processing for an object of processing placed on said discharging electrode, the apparatus comprising :

a high-frequency power supply unit for applying the high-frequency voltage to said discharging electrode, a matching unit for taking the matching in impedance between said high-frequency power supply unit and a discharging circuit which produces a plasma discharge, detection means for detecting at least one of voltage and current of said discharging circuit by virtue of a resistor inserted in a circuit which connects said matching unit and said discharging electrode, and judgement means for judging a time dependent change in internal state of said vacuum chamber through the comparison of the result of detection by said detection means with a preset reference value to give predetermined notice.

5. The apparatus of claim 4, wherein the detection means detects a voltage of the discharging circuit.

6. The apparatus of claim 4, wherein the detection means detects a current of the discharging circuit.

7. A plasma processing method in which a plasma generating gas is introduced into a vacuum chamber after the evacuation thereof and a high-frequency voltage is applied by a high-frequency power supply unit to a discharging electrode provided in said vacuum chamber to generate a plasma in said vacuum chamber, thereby performing a plasma processing for an object of processing placed on said discharging electrode, the method comprising:

a step of detecting an impedance of a discharging circuit by detecting at least one of voltage and current of a resistor connected between said discharging electrode and a matching unit which takes the matching in impedance between said high-frequency power supply unit and said discharging circuit, and a step of controlling said high-frequency power supply unit on the basis of the result of detection.

8. The method of claim 7, wherein the detection means detects a voltage of the resistor.

9. The method of claim 7, wherein the detection means detects a current of the resistor.

10. The method of claim 7, wherein the discharging circuit comprises the discharging electrode and a space of the vacuum chamber.

11. The method of claim 7, wherein the plasma processing generates a reverse sputtering.

12. The method of claim 7, wherein a single high-frequency power supply unit applies the high-frequency voltage.

13. A plasma processing method in which a plasma generating gas is introduced into a vacuum chamber after the evacuation thereof and a high-frequency voltage is applied by a high-frequency power supply unit to a discharging electrode provided in said vacuum chamber to generate a plasma in said vacuum chamber, thereby performing a plasma processing for an object of processing placed on said discharging electrode, the method comprising:

a step of detecting at least one of voltage and current of a discharging circuit which produces a plasma discharge, the detection being made by virtue of a resistor inserted in a circuit connecting said discharging electrode and a matching unit which takes the matching in impedance between said high-frequency power supply unit and said discharging circuit, and a step of judging a time dependent change in internal state of said vacuum chamber through the comparison of the result of detection with a preset reference value to give predetermined notice.

14. The method of claim 13, wherein the detection means detects a voltage of the discharging circuit.

15. The method of claim 13, wherein the detection means detects a current of the discharging circuit.

* * * * *